US008383961B2

(12) United States Patent
Shen (10) Patent No.: US 8,383,961 B2
(45) Date of Patent: Feb. 26, 2013

(54) EMI SHIELDS AND METHODS OF MANUFACTURING THE SAME

(75) Inventor: Steven Shen, Shenzhen (CN)

(73) Assignee: Laird Technologies, Inc., Earth City, MO (US)

(*) Notice: Subject to any disclaimer, the term of this patent is extended or adjusted under 35 U.S.C. 154(b) by 361 days.

(21) Appl. No.: 12/941,903

(22) Filed: Nov. 8, 2010

(65) Prior Publication Data

US 2011/0056742 A1 Mar. 10, 2011

Related U.S. Application Data

(63) Continuation-in-part of application No. PCT/IB2009/006752, filed on May 8, 2009.

(30) Foreign Application Priority Data

May 9, 2008 (CN) .......................... 2008 1 0096458

(51) Int. Cl.
*H05K 9/00* (2006.01)
(52) U.S. Cl. ........................................ 174/382; 174/385
(58) Field of Classification Search .................. 174/382, 174/385; 361/818
See application file for complete search history.

(56) References Cited

U.S. PATENT DOCUMENTS

| 5,095,177 | A | * | 3/1992 | Johnson ........................ 174/372 |
| 5,917,708 | A | | 6/1999 | Moran et al. |
| 6,275,683 | B1 | | 8/2001 | Smith |
| 6,552,261 | B2 | * | 4/2003 | Shlahtichman et al. ...... 174/384 |
| 6,897,371 | B1 | * | 5/2005 | Kurz et al. .................... 174/382 |
| 7,109,411 | B2 | | 9/2006 | Vinokor et al. |
| 7,285,732 | B2 | | 10/2007 | Vinokor et al. |
| 7,345,248 | B2 | | 3/2008 | Vinokor et al. |
| 7,358,447 | B2 | | 4/2008 | Gabower |
| 7,442,881 | B1 | * | 10/2008 | Chien ........................... 174/382 |
| 7,491,899 | B2 | * | 2/2009 | Zuehlsdorf et al. ........... 174/372 |
| 7,534,968 | B2 | * | 5/2009 | English et al. ................ 174/382 |
| 7,772,505 | B2 | * | 8/2010 | Poulsen ........................ 174/382 |
| 7,928,325 | B2 | * | 4/2011 | Tsai et al. ..................... 174/382 |
| 8,247,707 | B2 | * | 8/2012 | Li ................................. 174/382 |
| 8,247,709 | B2 | * | 8/2012 | Bennett et al. ................ 174/666 |

(Continued)

FOREIGN PATENT DOCUMENTS

| CN | 2414587 Y | 1/2001 |
| CN | 1285977 A | 2/2001 |

(Continued)

OTHER PUBLICATIONS

Chinese Second Office Action dated Dec. 30, 2010 (and English translation summarizing rejections therein) from Chinese Patent Application No. CN200810096458.6, which is related to the instant application through a priority claim; 4 pages.

(Continued)

*Primary Examiner* — Hung Ngo
(74) *Attorney, Agent, or Firm* — Harness, Dickey & Pierce, P.L.C.

(57) ABSTRACT

An electromagnetic interference (EMI) shielding apparatus generally includes a lid and a framework. The lid includes a top portion having at least one projection joining part thereon. The at least one projection joining part has a peripheral contour. The framework includes a top portion and a lateral side extending downward from the top portion. The top portion includes at least one joining opening having a peripheral contour coinciding with the peripheral contour of the at least one projection joining part of the lid. Accordingly, the at least one projection joining part of the lid is engagable with the at least one joining opening of the framework via an interference fit.

14 Claims, 3 Drawing Sheets

U.S. PATENT DOCUMENTS

| | | | |
|---|---|---|---|
| 2005/0072420 A1 | 4/2005 | Gershteyn | |
| 2007/0012479 A1 | 1/2007 | Vinokor et al. | |
| 2007/0235221 A1* | 10/2007 | Chang | 174/382 |
| 2008/0000683 A1 | 1/2008 | Vinokor et al. | |
| 2008/0158851 A1* | 7/2008 | Cochrane | 361/818 |
| 2009/0242264 A1* | 10/2009 | Lei | 174/382 |

FOREIGN PATENT DOCUMENTS

| | | |
|---|---|---|
| CN | 2777919 Y | 5/2006 |
| CN | 1914967 A | 2/2007 |
| CN | 101578032 | 11/2009 |
| JP | H07-254787 | 10/1995 |
| JP | 2001-196758 A | 7/2001 |
| WO | WO 2005/072420 | 8/2005 |
| WO | WO 2010/023549 | 3/2010 |

OTHER PUBLICATIONS

International Search Report dated Feb. 4, 2010, issued by the International Search Authority for International Patent Application No. PCT/IB2009/006752 (11 pages).

Chinese Office Action dated Jun. 23, 2010, issued by the Chinese Intellectual Property Office for Chinese Patent Application No. 200810096458.6, to which the subject application claims priority, and Summary of same in English (5 pages).

Chinese Notice of Completion of Formalities for Patent Registration and Notice of Decision of Granting Patent Right for Invention (English translations provided); Dated Mar. 18, 2011 from allowed Chinese Patent Application No. CN200810096458.6, which is related to the instant application through a priority claim; 5 pages.

Written Opinion (English translation provided) from PCT/IB2009/006752 (now published as WO 2010/023549) which is related to the instant application through a priority claim; dated Feb. 4, 2010, 6 pages.

International Preliminary Report for International Application No. PCT/IB2009/006752 (now published as WO2010/023549); dated Nov. 9, 2010, 4 pages.

* cited by examiner

EMI SHIELDS AND METHODS OF MANUFACTURING THE SAME

CROSS-REFERENCE TO RELATED APPLICATIONS

This application is a continuation-in-part of PCT application No. PCT/IB2009/006752 filed May 8, 2009, which claims the benefit of and priority to Chinese application No. 200810096458.6 filed on May 9, 2008. The entire disclosures of each of the above applications are incorporated herein by reference.

FIELD

The present disclosure relates generally to electromagnetic interference (EMI) shielding apparatus and methods of manufacturing the same.

BACKGROUND

This section provides background information related to the present disclosure which is not necessarily prior art.

In normal operations electronic/electric devices in installations usually generate undesirable electromagnetic energy, and such electromagnetic energy interferes with the operation of adjacent electronic/electric devices due to electromagnetic interference (EMI) transmissions generated via radiation. Such radiation results in electromagnetic interference (EMI) or radio frequency interference (RFI), which can interfere with the operation of other electronic devices within a certain proximity. Without adequate shielding, EMI/RFI may cause degradation or complete loss of important signals, thereby rendering the electronic equipment inefficient or inoperable. A common solution to ameliorate the effects of EMI/RFI is through the use of shields capable of absorbing and/or reflecting EMI energy. These shields are typically employed to localize EMI/RFI within its source, and to insulate other devices proximal to the EMI/RFI source.

A conventionally common shielding technique includes an apparatus or structure consisting of two component parts, namely a framework and a lid where the lid is mounted onto the framework. This shielding apparatus is functional to shield electric or electronic devices or components covered by the framework and the lid when the framework is mounted onto a PCB (printed circuit board) via a surface mount technology (SMT) welding method and then electrically connecting and mounting the lid onto the framework.

With such a two-part EMI shielding apparatus, the two component parts may have spacing between adjacent portions of the lid and the framework. This spacing allows EMI to pass therethrough, thereby reducing the shielding effectiveness of the two-part EMI shielding apparatus. With the tendency towards higher frequencies generated by more and more electronic devices, it is desirable, in order to acquire the desired shielding effect and to avoid RF (radio frequency) leak from the spacing, to reduce the spacing between the lid and the framework to be as small as practically possible.

To mount the lid onto the framework with currently available two-component shielding apparatus, bayonet catches or projections may be provided on the lateral sides of the lid and the framework. Since the bayonet catches or projections are located at the lateral side of the lid and the corresponding lateral side of the framework, it is necessary after assembly of the lid with the framework for the lateral side of the lid to partially overlap with the lateral side of the framework so that the bayonet catches or projections engage. But it is difficult to guarantee good engagement at each engaging location, and inferior engagement appears at locations of certain bayonet catches or projections, thus possibly increasing the fitting clearance. Resultantly, it is very difficult to achieve zero fitting clearance at the conjunction between the assembled lid and framework, and presence of such fitting clearance undermines the grounding and shielding performance and might lead to RF leak.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to wiring, cabling, or an enclosure in which electronic equipment is disposed.

SUMMARY

This section provides a general summary of the disclosure, and is not a comprehensive disclosure of its full scope or all of its features.

Disclosed herein are various exemplary embodiments of electromagnetic interference (EMI) shielding apparatus and methods of manufacturing EMI shielding apparatus.

In an exemplary embodiment, an electromagnetic interference (EMI) shielding apparatus generally includes a lid and a framework. The lid includes a top portion having at least one projection joining part thereon. The at least one projection joining part has a peripheral contour. The framework includes a top portion and a lateral side extending downward from the top portion. The top portion includes at least one joining opening having a peripheral contour coinciding with the peripheral contour of the at least one projection joining part of the lid. Accordingly, the at least one projection joining part of the lid is engagable with the at least one joining opening of the framework via an interference fit.

Methods of manufacturing and/or using EMI shielding apparatus are also disclosed herein. One such example method of manufacturing an EMI shielding apparatus generally includes forming a framework that includes a lateral side and a top portion having at least one joining opening. This example method also includes forming a lid that includes a top portion having at least one projection joining part corresponding in shape to the at least one joining opening of the framework. The lid's at least one projection joining part is engagable via interference fit with the corresponding joining opening of the top portion of the framework.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

The following description is merely exemplary in nature and is in no way intended to limit the present disclosure, application, or uses.

The inventor discloses herein exemplary embodiments of electromagnetic interference (EMI) shielding apparatus that include a lid or cover engagable to a framework or frame. Also disclosed herein are methods of manufacturing and/or using EMI shielding apparatus. As described herein, the disclosed EMI shielding apparatus is configured such that it is not only possible not to occupy the lateral space of the shielding apparatus, but it is also possible to achieve zero fitting clearance between the lid and the framework and ensure the grounding and shielding performance of the shielding apparatus.

In an exemplary embodiment, an EMI shield or shielding apparatus comprises a lid and a framework. The lid includes a top portion on which is disposed at least one projection joining part that projects toward the framework. The framework includes a top portion and a lateral side downwardly extending from the top portion. At least one joining opening is on the top portion that corresponds (e.g. same shape, etc.) to the projection joining part of the lid. The peripheral contour of each joining opening coincides with peripheral contour of the corresponding projection joining part. The projection joining part of the lid is engaged with the corresponding joining opening of the framework via an interference or friction fit, to thereby form the assembled structure of the lid with the framework. Advantageously, this exemplary embodiment of the two-component EMI shield makes it unnecessary to fabricate the lateral side or sides of the lid. In turn, using a lid without any lateral sides or sidewalls (e.g., a lid having a flat plate shape, etc.) thus avoids occupation of the lateral space of the shield saving cost for the material otherwise necessary for producing the lateral side(s) of the lid, makes it possible to achieve a zero fitting clearance between the lid and the framework, and helps ensure grounding and shielding performance of the shield.

Since the lid may be engaged by way of an interference or friction fit of the projection joining part at the lid's top portion with the joining opening at the top portion of the framework, it becomes possible not to provide the lid with any lateral sides in this exemplary embodiment. Accordingly, the space at the lateral side of the shielding apparatus is not occupied thus saving side room for the PCB board or other substrate, which is unlike those EMI shields in which a lid's lateral sides are engaged to a framework's lateral sides by using bayonet catches or projections. Moreover, since there is no need to provide any lateral sides for the lid, there is also a possible savings (e.g., 30% reduction, etc.) in the raw material otherwise needed to create sidewalls of the lid in comparison to lids having lateral sides. Furthermore, since the lid is connected to the framework through an interference fit (which is usually referred to as riveting in the punching field) the projection joining part closely contacts with the joining opening at their peripheries, and the interface or conjunction between the lid and the framework is almost without spacing, it is possible to achieve a zero fitting clearance between the lid and the framework. This, in turn, helps ensure good grounding and shielding performance of the shield, and helps prevent RF from leaking from the conjunction or interface between the lid and the framework. The lid is also removable from the framework and may be reused by reattachment to the framework.

By way of example, the projection joining part of the top portion of the lid has a projection height of about 0.1 millimeter to about 0.19 millimeters (e.g., 0.1 millimeter, 0.15 millimeters, 0.19 millimeters, etc.), or one-half to four-fifths of the wall thickness of the top portion of the lid in an exemplary embodiment. The dimensions given in this paragraph (as are all dimensions given herein) are provided for illustrative purposes only, as the particular dimensions may be varied and are not intended to limit the scope of the present disclosure.

In an exemplary embodiment of an EMI shield disclosed herein, the peripheral contour of the projection joining part and the peripheral contour of the joining opening are both formed as convex-concave shapes having a plurality of convex portions and/or concave portions. In this embodiment, a curved connection contour is formed at the conjunction between the projection joining part and the corresponding joining opening to further enhance connection reliability and avoid RF leakage.

As examples of the convex-concave shapes, convex portions/concave portions can be arranged in intervals or consecutively on the peripheral contours, for instance, the peripheral contours can also be arranged in saw-tooth shapes. If the peripheral contour of the joining opening and the peripheral contour of the projection joining part are all formed as shapes with straight lines, elongate slots might be formed between the peripheral contour of the joining opening and the peripheral contour of the projection joining part due to potential processing error or fitting error, and this might cause electromagnetic or RF leakage. In contrast, exemplary embodiments of the present disclosure include peripheral contours that include convex portions/concave portions arranged in intervals or consecutively. Thus, relatively long segments of shapes with straight lines on the peripheral contours are not needed to be formed, such that relatively large or relatively long slots will not be formed regardless of the existence of certain processing error and fitting error, and the risk of electromagnetic or RF leakage is greatly reduced.

In an exemplary embodiment, the peripheral contour of the joining opening includes convex-concave shapes disposed such that a distance of spacing between a convex/concave portion and a convex/concave portion adjacent to each other on at least a part of the peripheral contour of the joining opening is lower than one twentieth of the wavelength corresponding to the electromagnetic frequency of the electronic device to be shielded by the EMI shielding apparatus. Also in this exemplary embodiment, the peripheral contour of the projection joining part includes convex-concave shapes disposed such that a distance of spacing between a convex/concave portion and a convex/concave portion adjacent to each other on at least a part of the peripheral contour of the projection joining part is lower than one twentieth of the wavelength corresponding to the electromagnetic frequency of the electronic device to be shielded by the EMI shielding apparatus. According to the electromagnetic frequency of a high-frequency electronic device usually employed on the substrate, one twentieth of the wavelength corresponding to the electromagnetic frequency is not less than about 3 millimeters. With respect to the electromagnetic frequency of a low-frequency electronic device, one twentieth of the wavelength corresponding to the electromagnetic frequency is by far greater than about 3 millimeters. As a concrete example, the distance of spacing is set as not greater than about 3 millimeters. It is thus possible to effectively shield the electronic device regardless of whether it is a low-frequency or high-frequency device. According to one example, the distance of spacing is in the range of about 0.1 millimeter to about 2.5 millimeters (e.g., 0.1 millimeter, 1 millimeter, 2 millimeters, 2.5 millimeters, etc.). The dimensions given in this paragraph (as are all dimensions given herein) are provided for illustrative purposes only, as the particular dimensions may be varied and are not intended to limit the scope of the present disclosure.

In an exemplary embodiment of an EMI shield, the lid is formed as a substantially flat plate shape. Since the lid does not have any downwardly extending sidewalls, this lid configuration is different than the lids in those EMI shields where a lid's sidewall overlaps with a sidewall of the framework to occupy too much space. Moreover, the substantial flat plate shape of the lid is relatively simple in structure, easy in processing and assembly, and facilitates prevention of electromagnetic leakage after assembly.

Also disclosed herein are methods of manufacturing EMI shielding apparatus. In an example embodiment, a method generally includes forming a framework having a top portion and a lateral side; disposing at least one joining opening at the top portion of the framework; forming a lid having a top portion; and forming a projection joining part corresponding in shape to the joining opening at the top portion of the lid toward the top portion of the framework. The projection joining part of the top portion of the lid is engagable via interference fit with the corresponding joining opening of the top portion of the framework. By employing this exemplary method, the lid can thus be joined by an interference fit or riveting to the framework at the top portions of the lid and framework. And, it is unnecessary to have a connection of the lateral sides of the lid and the framework, such that there is no need to provide the lid with a lateral side. After the lid is engaged with the framework via interference fit, the space at the lateral side of the EMI shielding apparatus is not occupied, and also the material for producing the lateral side of the lid is saved, thereby reducing production cost. Moreover, the connection mode whereby the lid is engaged with the framework via interference fit substantially achieves zero clearance of assembly engagement, thus ensuring the grounding and shielding performance of the shielding apparatus, and preventing RF from leaking out of the interface or conjunction between the lid and framework.

In an exemplary embodiment, metal partial-punching or half shearing may be employed to form the projection joining part at the top portion of the lid. Using metal partial-punching or half shearing effectively guarantees the processing quality at the peripheral contour of the projection joining part, thus facilitating the assembling engagement of the projection joining part with the joining opening. By way of example, a depth of the metal partial-punching or half shearing may range from about 0.1 millimeter to about 0.19 millimeters (e.g., 0.1 millimeter, 0.15 millimeters, 0.19 millimeters, etc.), or one-half to four-fifths of the wall thickness of the top portion of the lid. The dimensions given in this paragraph (as are all dimensions given herein) are provided for illustrative purposes only, as the particular dimensions may be varied and are not intended to limit the scope of the present disclosure.

With reference now to the figures, FIGS. 1 through 5 illustrate an exemplary embodiment of an EMI shielding apparatus embodying one or more aspects of the present disclosure.

Figure 1:
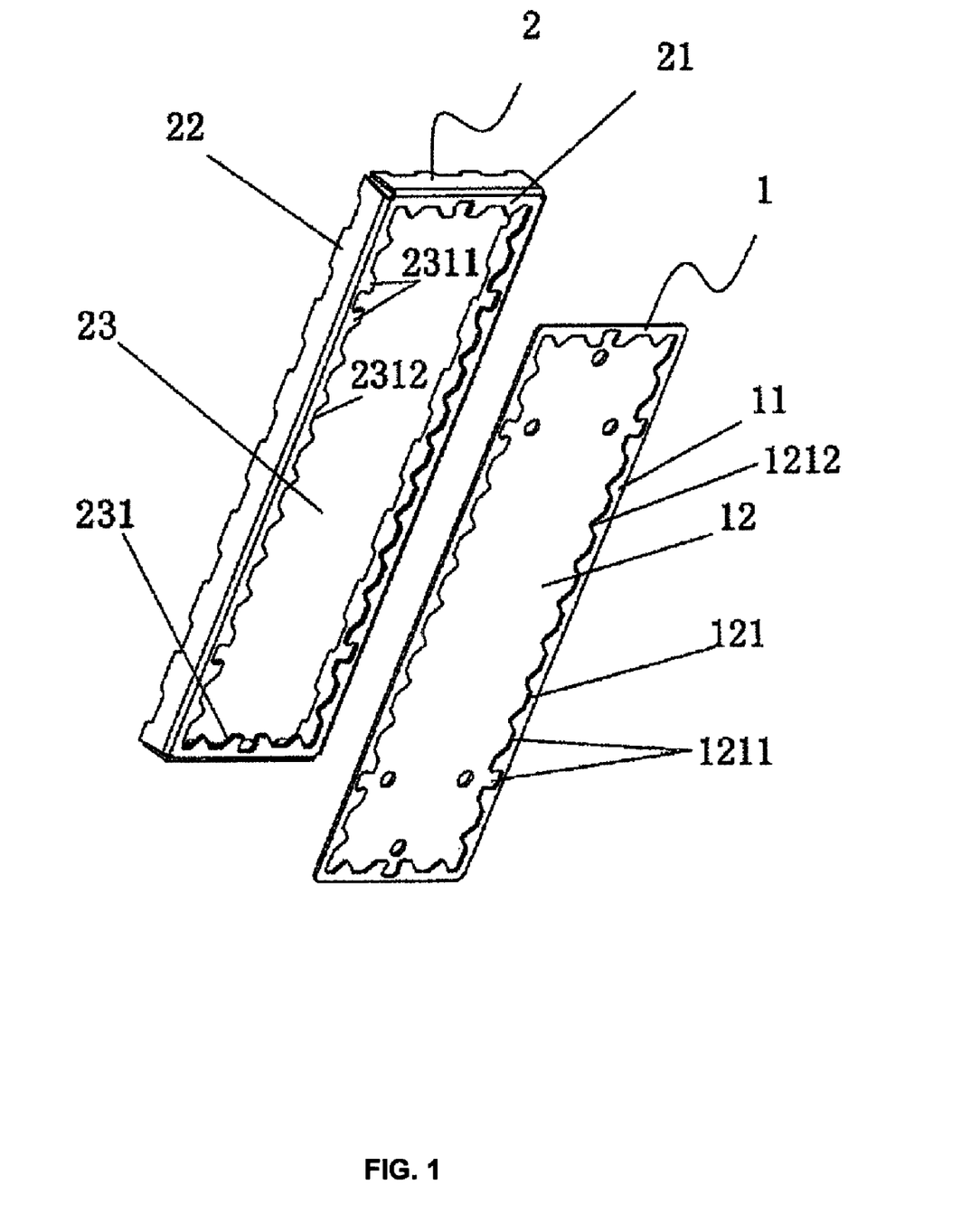
FIG. 1 is an exploded perspective view of an exemplary embodiment of an electromagnetic interference (EMI) shielding apparatus including a lid and a framework according to one or more aspects of the present disclosure.
Figure 2:
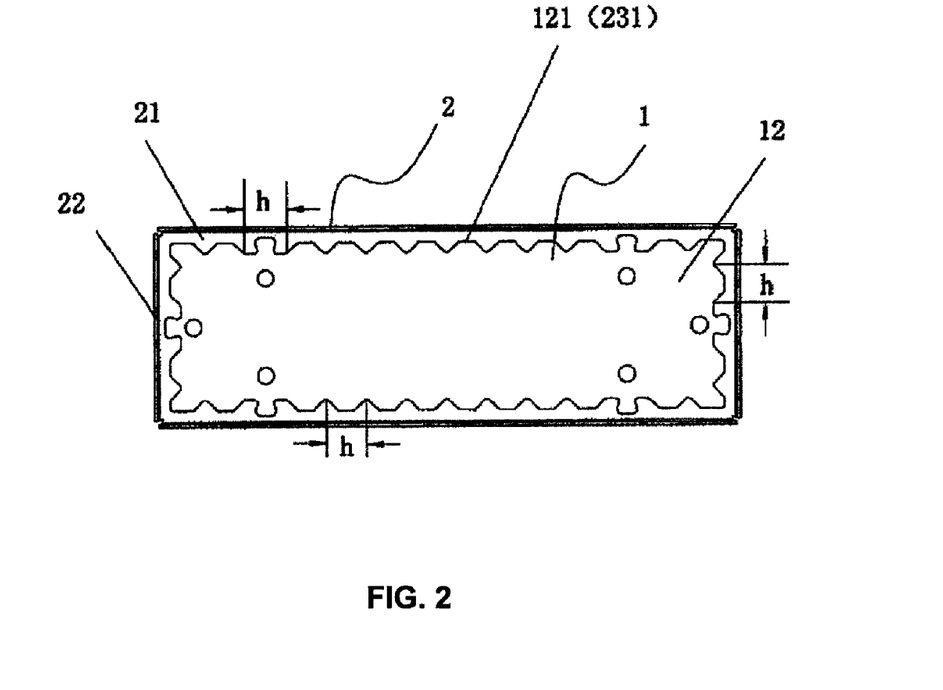
FIG. 2 is a bottom view of the EMI shielding apparatus shown in FIG. 1 and illustrating the lid and the framework assembled according to one or more aspects of the present disclosure.

As shown in FIG. 1, the EMI shielding apparatus includes a lid or cover 1 and a framework or frame 2. When assembled together as shown in FIG. 2, the lid 1 and framework 2 constitute the shielding apparatus. The framework 2 may be a single-piece framework structure as shown in FIG. 1. Alternatively, the framework 2 may comprise a multi-piece framework structure and/or a framework structure having a plurality of separation chambers (not shown) in other exemplary embodiments.

With continued reference to FIG. 1, the lid 1 in this illustrated embodiment only includes a top portion 11 without any lateral sides or sidewalls. The lid 1 includes at least one projection joining part 12 on the top portion 11 that projects towards the framework 2.

The framework 2 includes a top portion 21 and lateral sides 22 downwardly extending from the top portion 21. The top portion 21 has at least one joining opening 23 that corresponds to the projection joining part 12 of the lid 1.

The peripheral contour 231 of each joining opening 23 coincides with the peripheral contour 121 of the corresponding projection joining part 12. The projection joining part 12 of the lid 1 may thus be engaged on the corresponding joining opening 23 of the framework 2 via an interference or friction fit, thus forming the assembled structure of the lid 1 with the framework 2. In operation, the lid 1 may be removed from the framework 2 by means of a tool (e.g., a shim, etc.) to disengage the projection joining part 12 from the corresponding joining opening 23. The lid 1 can also be reassembled and reattached to the framework 2.

A lid and framework disclosed herein may be made in a variety of ways. An example embodiment of a method of manufacturing such a lid and framework may include forming a framework 2 having a top portion 21 and lateral sides 22; disposing at least one joining opening 23 at the top portion 21 of the framework 2; and forming a lid 1 having a top portion 11 that includes at least one projection joining part 12 corresponding in shape to the joining opening 23 toward the top portion 21 of the framework 2. The method may also include engaging, via interference fit, the projection joining part 12 of the top portion 11 of the lid 1 with the corresponding joining opening 23 of the top portion 21 of the framework 1 to thereby form the EMI shielding apparatus.

As easily understandable to a person skilled in the art, there is no requirement as to the forming sequence of the framework 2 and the lid 1, as it is possible to firstly form the lid 1 and subsequently the framework 2, or firstly form the framework 2 and subsequently the lid 1. As another example, the lid 1 may be formed simultaneously as the framework 2 is formed. There is no restriction for such sequence.

Since the lid 1 may be engaged with the framework 2 via interference fit of the projection joining part 12 of the top portion 11 with the joining opening 23 of the top portion 21 of the framework 2, it is possible not to provide the lid 1 with any lateral sides. This is in contrast to existing EMI shields that include bayonet catches or projections at the lateral sides of the lid that engage with the lateral sides of the framework. Having a lid without any lateral sides enables the space at the lateral side of the EMI shielding apparatus to not be occupied thus saving side room for the PCB board or other substrate. Moreover, there is also a savings (e.g., 30% reduction, etc.) in the raw material otherwise needed to create sidewalls of the lid, thereby reducing the production cost. Furthermore, since the lid 1 is connected to the framework 2 via interference fit at their top portions, the projection joining part 12 closely contacts with the joining opening 23 at their peripheries, and the interface or conjunction between the lid 1 and the framework 2 is almost without spacing, thereby achieving zero fitting clearance between the lid 1 and the framework 2. In turn, this helps ensure grounding and shielding performance of the shielding apparatus, and helps prevent RF from leaking from the interface or conjunction between the lid 1 and the framework 2.

As shown in FIG. 1, the lid 1 is formed as a substantially flat plate shape without any sidewalls or lateral sides. The lid 1 is generally rectangular, although the lid may be formed in other suitable shapes in other embodiments.

The number of the projection joining parts 12 on the top portion 11 of the lid 1 and the corresponding number of the joining openings 23 on the top portion 21 of the framework 2 may vary and be determined or set as desired. To this end, the drawings of the illustrated embodiment merely provide one exemplary setting of only one projection joining part 12 and one joining opening 23 by way of example. In case of a relatively large-sized shield or shielding apparatus, it is possible to set two or more projection joining parts 12 and joining openings 23 to enhance connection reliability.

In an exemplary embodiment of an EMI shield, the projection joining part 12 can be formed by metal partial-punching or half shearing on the top portion 11 of the lid 1. Employment of the method of metal partial-punching or half shearing effectively helps guarantee the processing quality at the peripheral contour 121 of the projection joining part 12, thus facilitating the assembling engagement of the projection joining part 12 with the joining opening 23.

Figure 3:
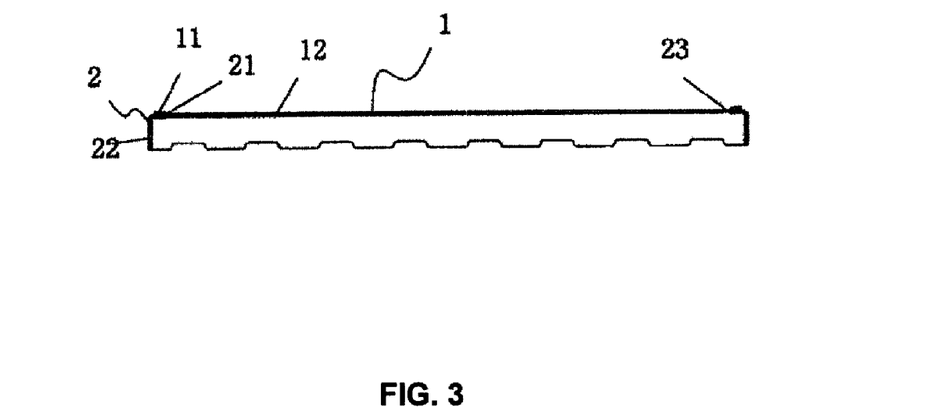
FIG. 3 is a side cross-sectional view of the EMI shielding apparatus shown in FIG. 2.

With reference now to FIG. 3, the projection joining part 12 of the top portion 11 of the lid 1 may have a projection height ranging from about 0.1 millimeter to about 0.19 millimeters (e.g., 0.1 millimeter, 0.15 millimeters, 0.19 millimeters, etc.), or one-half to four-fifths of the wall thickness of the top portion 11 of the lid 1 in exemplary embodiments. Correspondingly, the depth of the projection joining part 12 formed by metal partial-punching or half shearing may range from about 0.1 millimeter to about 0.19 millimeters (e.g., 0.1 millimeter, 0.15 millimeters, 0.19 millimeters, etc.), or one-half to four-fifths of the wall thickness of the top portion 11 of the lid 1 in exemplary embodiments. After the projection joining part 12 is riveted or engaged via interference fit to the joining opening 23, the riveted connection depth may also thus range from about 0.1 millimeters to about 0.19 millimeters (e.g., 0.1 millimeter, 0.15 millimeters, 0.19 millimeters, etc.), or one-half to four-fifths of the wall thickness of the top portion 11 of the lid 1. The dimensions given in this paragraph (as are all dimensions given herein) are provided for illustrative purposes only, as the particular dimensions may be varied and are not intended to limit the scope of the present disclosure.

In the illustrated embodiment shown in FIGS. 1 and 2, the peripheral contour 121 of the projection joining part 12 and the peripheral contour 231 of the joining opening 23 are both formed as convex-concave shapes having a plurality of convex portions 1211, 2311 and/or concave portions 1212, 2312. Thus, a curved connection contour is formed at the conjunction or interface between the projection joining part 12 and the corresponding joining opening 23, which helps further enhance connection reliability and avoid RF leakage.

Figure 4:
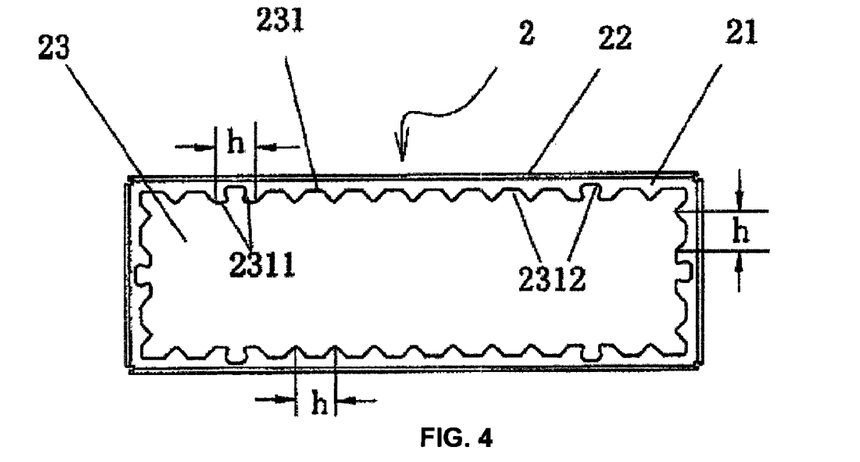
FIG. 4 is a bottom view of the framework shown in FIG. 1.
Figure 5:
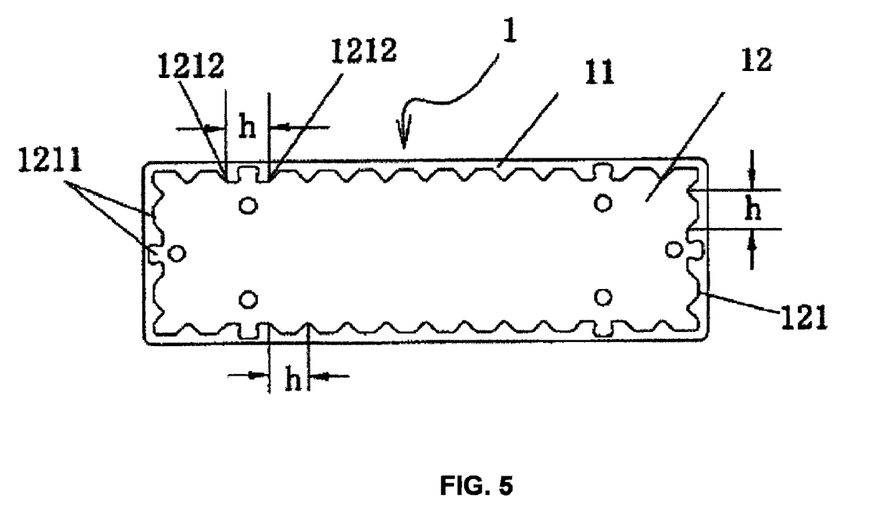
FIG. 5 is a top view of the lid shown in FIG. 1.

With reference to FIGS. 2, 4, and 5, the convex-concave shapes may be so disposed or positioned such that convex/concave portions adjacent to each other on at least a part of the peripheral contour 121, 231 of the joining opening 23 or of the projection joining part 12 are spaced apart or separated by a distance of spacing h that is less than one twentieth of the wavelength corresponding to the electromagnetic frequency of the electronic device to be shielded by the EMI shielding apparatus. As a specific example, the distance of spacing h may be set to be not greater than 3 millimeters.

As shown in FIGS. 1 and 2, the shape of the convex portion and/or concave portion can be set as desired. By way of example, convex portion and/or concave portion may have the shape of a dovetail, a V shape, a ladder shape, or any other suitable shape. The shapes illustrated in FIGS. 1 through 5 are provided for illustrative purposes only, as the particular shapes of the projection joining part of the lid and the joining opening of the framework may be varied and are not intended to limit the scope of the present disclosure.

The description of the present disclosure is merely exemplary in nature, so that various modifications not departing from the essentials of the present disclosure should be covered within the scope of the present disclosure. These modifications shall not be regarded as departing from the spirit and scope of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," "one", "the", and "said" may be intended to include the plural forms as well and indicate one or more of such elements or features, unless the context clearly indicates otherwise. The terms "comprises," "comprising," "including," and "having," are inclusive and therefore specify the presence of stated features, integers, steps, operations, elements, and/or components, and imply possible inclusion of elements or features in addition to the specific elements or features currently under discussion and do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "on", "under", "top", "bottom" and the like, may be used herein for ease of description to describe one element or feature's relationship to another element(s) or feature(s) as illustrated in the figures and are merely directed to referential purposes, rather than meant for restrictions. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. Terms such as "before", "backward/s", "after", "bottom" and "side" describe orientations of the component parts in a consistent and random reference system, which becomes apparent with reference to literal descriptions and relevant figures about the component parts under discussion. Such terms may include the words/expressions as definitely recited above, their derivatives and analogues thereof.

Disclosure of values and ranges of values for specific parameters are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) shielding apparatus comprising:
   a lid including a top portion having at least one projection joining part thereon, the at least one projection joining part having a peripheral contour; and
   a framework including a top portion and a lateral side extending downward from the top portion, the top portion including at least one joining opening having a peripheral contour coinciding with the peripheral contour of the at least one projection joining part of the lid;
   whereby the at least one projection joining part of the lid is engagable with the at least one joining opening of the framework via an interference fit.

2. The apparatus of claim 1, wherein the peripheral contour of the at least one projection joining part and the peripheral contour of the at least one joining opening comprise convex and/or concave shapes.

3. The apparatus of claim 1, wherein:
   the peripheral contour of the at least one projection joining part comprises a plurality of convex portions and/or concave portions; and
   the peripheral contour of the at least one joining opening comprises a plurality of convex portions and/or concave portions.

4. The apparatus of claim 3, wherein:
   the at least one projection joining part is configured such that a distance of spacing between a convex/concave portion and a convex/concave portion adjacent to each other on at least a part of the peripheral contour of the at least one projection joining part is lower than one twentieth of the wavelength corresponding to the electromagnetic frequency of the electronic device to be shielded by the EMI shielding apparatus; and
   the at least one joining opening is configured such that a distance of spacing between a convex/concave portion and a convex/concave portion adjacent to each other on at least a part of the peripheral contour of the at least one joining opening is lower than one twentieth of the wavelength corresponding to the electromagnetic frequency of the electronic device to be shielded by the EMI shielding apparatus.

5. The apparatus of claim 4, wherein the distance of spacing is not greater than 3 millimeters.

6. The apparatus of claim 1, wherein the lid has a substantially flat plate shape.

7. The apparatus of claim 1, wherein the lid does not include any sidewalls depending downwardly from the top portion.

8. The apparatus of claim 1, wherein the peripheral contour of each joining opening coincides with the peripheral contour of the corresponding projection joining part.

9. The apparatus of claim 1, wherein the at least one projection joining part projects towards the framework.

10. The apparatus of claim 1, wherein the at least one projection joining part of the lid is engaged with the at least one corresponding joining opening of the framework via an interference fit such that the lid is assembled to the framework.

11. The apparatus of claim 1, wherein:
   the at least one projection joining part has a projection height from about 0.1 millimeters to about 0.19 millimeters; or
   the at least one projection joining part has a projection height of about 0.15 millimeters.

12. The apparatus of claim 1, wherein the at least one projection joining part has a projection height that is one-half to four-fifths of the wall thickness of the top portion of the lid.

13. An electromagnetic interference (EMI) shielding apparatus comprising:
   a framework including a top portion and a lateral side extending downward from the top portion, the top portion including at least one joining opening comprising a plurality of convex portions and concave portions;

a lid including a top portion and having a substantially flat plate shape without any sidewalls depending downwardly from the top portion, the top portion including at least one projection joining part thereon projecting toward the framework, the at least one projection joining part having a peripheral contour comprising a plurality of convex portions and concave portions coinciding with the peripheral contour of the at least one joining opening of the top portion of the framework;

whereby the at least one projection joining part of the lid is engagable with the at least one joining opening of the framework via an interference fit.

14. The apparatus of claim 13, wherein the at least one projection joining part of the lid is engaged with the at least one corresponding joining opening of the framework via an interference fit such that the lid is assembled to the framework.

* * * * *